(12) United States Patent
Makino

(10) Patent No.: US 7,333,862 B2
(45) Date of Patent: Feb. 19, 2008

(54) POSITION CONTROL DEVICE OF MOVING BODY, STAGE DEVICE USING THE POSITION CONTROL DEVICE, AND POSITION CONTROL METHOD OF MOVING BODY

(75) Inventor: Kennichi Makino, Hiratsuka (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 0 days.

(21) Appl. No.: 11/599,512

(22) Filed: Nov. 15, 2006

(65) Prior Publication Data

US 2007/0068231 A1 Mar. 29, 2007

Related U.S. Application Data

(63) Continuation of application No. PCT/JP2005/012406, filed on Jul. 5, 2005.

(30) Foreign Application Priority Data

Jul. 14, 2004 (JP) .............................. 2004-207526

(51) Int. Cl.
  G05B 19/18 (2006.01)
  G06F 7/00 (2006.01)
  G06F 17/00 (2006.01)
  G06F 19/00 (2006.01)
  B60G 23/00 (2006.01)
  B62C 3/00 (2006.01)
  B62K 25/00 (2006.01)

(52) U.S. Cl. .......................... 700/56; 700/60; 700/61; 700/66; 701/36; 701/37; 701/38; 701/41; 318/560; 318/566

(58) Field of Classification Search ............ 701/36–41; 700/56–61; 318/560–689
See application file for complete search history.

(56) References Cited

U.S. PATENT DOCUMENTS

| 4,347,996 | A | * | 9/1982 | Grosso ....................... 244/3.16 |
| 4,376,416 | A | * | 3/1983 | Carver ..................... 114/39.21 |
| 4,982,681 | A | * | 1/1991 | Jarlan ......................... 114/264 |
| 5,063,512 | A | * | 11/1991 | Kamimura et al. ........... 701/37 |
| 5,090,260 | A | * | 2/1992 | Delroy ........................ 74/537 |
| 5,798,885 | A | * | 8/1998 | Saiki et al. .............. 360/77.08 |
| 5,963,398 | A | * | 10/1999 | Tohkairin ................ 360/264.7 |
| 6,016,547 | A | * | 1/2000 | Ono ............................ 713/300 |
| 6,137,646 | A | * | 10/2000 | Okamura et al. ............. 360/51 |
| 6,490,025 | B1 | * | 12/2002 | Makinouchi et al. ......... 355/53 |
| 6,584,367 | B1 | * | 6/2003 | Makino et al. ............... 700/60 |
| 2001/0019229 | A1 | | 9/2001 | Sawai et al. |

(Continued)

FOREIGN PATENT DOCUMENTS

JP 07-115053 5/1995

(Continued)

*Primary Examiner*—Anthony Knight
*Assistant Examiner*—Sunray Chang
(74) *Attorney, Agent, or Firm*—Squire, Sanders & Dempsey L.L.P.

(57) ABSTRACT

A position control device of a moving body, by which position control device a moving body can be driven in a translational manner with high precision where the moving body is not rotated in a yawing direction even if disturbance is input, a stage device using the position control device, and a position control method of a moving body, is provided.

18 Claims, 8 Drawing Sheets

U.S. PATENT DOCUMENTS

2004/0112164 A1  6/2004  Asano et al.

FOREIGN PATENT DOCUMENTS

| JP | 09-184537 | 7/1997 |
| JP | 2001-022448 | 1/2001 |
| JP | 2001-0238485 | 8/2001 |
| JP | 2001-238485 | 8/2001 |
| JP | 2001-242937 | 9/2001 |
| JP | 2001-327152 | 11/2001 |
| JP | 2004-146807 | 5/2004 |

* cited by examiner

POSITION CONTROL DEVICE OF MOVING BODY, STAGE DEVICE USING THE POSITION CONTROL DEVICE, AND POSITION CONTROL METHOD OF MOVING BODY

CROSS-REFERENCE TO RELATED APPLICATION

This application is a U.S. continuation application filed under 35 USC 111(a) claiming benefit under 35 USC 120 and 365(c) of PCT application JP05/012406, filed Jul. 5, 2005, which claims priority to Application Ser. No. 2004-207526, filed in Japan on Jul. 14, 2004. The foregoing applications are hereby incorporated herein by reference.

BACKGROUND OF THE INVENTION

1. Field of the Invention

The present invention generally relates to position control devices of moving bodies, stage devices using the position control devices, and position control methods of moving bodies. More particularly, the present invention relates to a position control device of a moving body, for which the position control device rotational operation of the moving body (stage) is prevented when both ends of the moving body are driven in a translational manner, a stage device using the position control device, and a position control method of a moving body.

2. Description of the Related Art

A device called an XY stage device has a structure where an X stage moving in an X direction is provided at a Y stage moving in a Y direction. The XY stage device has a position control device of a moving body. The position control device controls moving positions of the stages (moving bodies).

In addition, there is a device called a gantry moving type stage device among these kinds of the devices. As discussed in Japanese Laid-Open Patent Application Publication No. 2001-238485 (Japanese Patent No. 3481540), in the gantry moving type stage device, a gate shape first moving body, namely a Y stage, moves above a substrate held on a table at a constant speed.

A second moving body, namely an X stage, is provided at the first moving body. The second moving body moves in an X direction perpendicular to the Y direction. Various kinds of jigs are provided on the second moving body. In the XY stage device, while the second moving body is moved to an optional position of a X direction stroke, the first moving body is moved in the Y direction.

Thus, in a case where the first moving body is moved in the Y direction while the second moving body is moved in the X direction, if a command value is output so that the same thrust forces (driving forces) are generated by first and second linear motors configured to drive the first moving body, the position of the center of gravity of a moving body unit including the first and second moving bodies is changed accompanying movement of the second moving body. Therefore, a rotational force whose center is a Z axis crossing the position of the center of gravity acts on the moving body unit.

Because of this, in a state where the second moving body is not positioned in the center of a moving area in the Y direction, for moving the first moving body in the Y direction, two thrust forces from a pair of the linear motors applied to the first moving body are made different so that moments of two forces around the center of gravity of the first moving body by both thrust forces cancel each other.

As a result of this, the moments of two forces around the center of gravity generated by the thrust force for driving the first moving body in a translational manner cancel each other, so that the thrust force is prevented from applying a rotational force to the first moving body.

However, in the above-discussed related art XY stage device, two thrust forces applied from a pair of the linear motors to the first moving body are controlled so that the moments of forces around the center of gravity generated by the two thrust forces cancel each other. Therefore, for example, even if a force in a rotational direction acts on the first moving body due to disturbance so that the first stage is rotated at a certain angle and the first stage is inclined in the yawing direction, the thrust forces of a pair of the linear motors are determined on the assumption that the first stage is driven so as to not be inclined against the X axial direction.

Because of this, in the related art XY stage device, if the first stage is rotated at a designated angle with respect to the Z axis, the first stage is driven in the Y direction in a state where inclination with the X axis is not corrected.

Therefore, when the disturbance is input, in the above-discussed feedback control, it may be difficult to drive the moving body in a translational manner with high precision and without rotating the moving body in the yawing direction.

SUMMARY OF THE INVENTION

Accordingly, one or more embodiments of the present invention can provide a novel and useful position control device of a moving body, stage device using the position control device, and position control method of a moving body in which one or more of the problems described above are eliminated.

More specifically, one or more embodiments of the present invention can provide a position control device of a moving body, by which position control device a moving body can be driven in a translational manner with high precision where the moving body is not rotated in a yawing direction even if disturbance is input, a stage device using the position control device, and a position control method of a moving body.

One or more embodiments of the present invention can provide a position control device of a moving body, wherein first and second driving parts configured to drive corresponding ends of a first moving body movably provided in a first axial direction and a third driving part configured to drive a second moving body moving a second axial direction perpendicular to the first axial direction are controlled so that a moving body unit formed by the first moving body and the second moving body can be moved, the position control device of the moving body including:

a position of center of gravity calculating part configured to calculate a position of a center of gravity of the moving body unit corresponding to a moving position of the second moving body;

a coefficient of distribution calculating part configured to calculate a coefficient of distribution setting a distribution ratio of a thrust force of the first driving part and a thrust force of the second driving part corresponding to the position of the center of gravity calculated by the position of center of gravity calculating part;

a command value calculating part configured to multiply a first axis thrust force target value calculated by a position control compensator in the first axial direction by the coefficient of distribution calculated by the coefficient of distribution calculating part and configured to calculate a first axis thrust force command value of the first and second driving parts so that moments of forces in rotational directions due to the thrust forces on the first and second driving parts acting around the axis of the center of gravity can be balanced;

a moment of inertia calculating part configured to calculate a moment of inertia in a rotational direction wherein the position of the center of gravity of the moving body unit that changes corresponding to the moving position of the second moving body is an axis;

a rotational direction thrust force calculating part configured to calculate a third axis thrust force command value around the axis of the center of gravity so that a ratio of the moment of inertia calculated by the moment of inertia calculating part to a thrust force gain of a position control compensator in the rotational direction can be constant; and a driving thrust force command value calculating part configured to calculate thrust force command values for the first and second driving parts by using the first axis thrust force command value and the third axis thrust force command value, respectively.

One or more embodiments of the present invention can provide a stage device, including:

a fixed base;

a first stage movably provided in a first axial direction against the fixed base;

a second stage movably provided at the first stage in a second axial direction perpendicular to the first axial direction;

first and second driving parts configured to apply thrust forces to vicinities of corresponding ends of the first stage;

a third driving part configured to drive the second stage;

first and second position detectors configured to detect moving positions in the vicinities of the corresponding ends of the first stage;

a third position detector configured to detect a moving position of the second stage; and a control part configured to control the first and second driving parts so that a moving body unit formed by the first stage and the second stage can be moved;

wherein the control part includes a position of center of gravity calculating part configured to calculate a position of a center of gravity of the moving body unit corresponding to a moving position of the second moving body;

a coefficient of distribution calculating part configured to calculate a coefficient of distribution setting a distribution ratio of a thrust force of the first driving part to a thrust force of the second driving part corresponding to the position of the center of gravity calculated by the position of center of gravity calculating part;

a command value calculating part configured to multiply a first axis thrust force target value calculated by a position control compensator in the first axial direction by the coefficient of distribution calculated by the coefficient of distribution calculating part and configured to calculate a first axis thrust force command value for the first and second driving parts so that moments of forces in rotational directions due to the thrust forces of the first and second driving parts acting around the axis of the center of gravity can be balanced;

a moment of inertia calculating part configured to calculate a moment of inertia in a rotational direction wherein the position of the center of gravity of the moving body unit that changes corresponding to the moving position of the second moving body is an axis;

a rotational direction thrust force calculating part configured to calculate a third axis thrust force command value around the axis of the center of gravity so that a ratio of the moment of inertia calculated by the moment of inertia calculating part to a thrust force gain of a position control compensator in the rotational direction can be constant; and a driving thrust force command value calculating part configured to calculate thrust force command values for the first and second driving parts by using the first axis thrust force command value and the third axis thrust force command value, respectively.

One or more embodiments of the present invention can provide a position control method of a moving body, wherein first and second driving parts configured to drive corresponding ends of a first moving body movably provided in a first axial direction and a third driving part configured to drive a second moving body moving a second axial direction perpendicular to the first axial direction are controlled so that a moving body unit formed by the first moving body and the second moving body can be moved, the position control method of the moving body comprising:

a position of center of gravity calculating step of calculating a position of a center of gravity of the moving body unit corresponding to a moving position of the second moving body;

a coefficient of distribution calculating step of calculating a coefficient of distribution setting a distribution ratio of a thrust force of the first driving part and a thrust force of the second driving part corresponding to the position of the center of gravity calculated by the position of center of gravity calculating step;

a command value calculating step of multiplying a first axis thrust force target value calculated by a position control compensator in the first axial direction by the coefficient of distribution calculated by the coefficient of distribution calculating step and configured to calculate a first axis thrust force command value of the first and second driving parts so that moments of forces in rotational directions due to the thrust forces on the first and second driving parts acting around the axis of the center of gravity can be balanced;

a moment of inertia calculating step of calculating a moment of inertia in a rotational direction wherein the position of the center of gravity of the moving body unit that changes corresponding to the moving position of the second moving body is an axis;

a rotational direction thrust force calculating step of calculating a third axis thrust force command value around the axis of the center of gravity so that a ratio of the moment of inertia calculated by the moment of inertia calculating step to a thrust force gain of a position control compensator in the rotational direction can be constant; and a driving thrust force command value calculating step of calculating thrust force command values for the first and second driving parts by using the first axis thrust force command value and the third axis thrust force command value, respectively.

According to the above-mentioned position control device of the moving body, the stage device using the position control device, or the position control method of the moving body, the rotational forces generated by the thrust forces of the first and second driving parts in the rotational direction can act around the center of gravity of the first moving body corresponding to the position of the center of gravity calculated by the position of center of gravity calculating part. The coefficient of distribution can set the ratio of distribution of the thrust force of the first driving part to the thrust force of the second driving part so that the moments of two forces acting in the opposite directions from each other can be balanced. The command values distributed to the first and second driving parts and the command value calculated by the rotational direction thrust force calculating part can be added for calculating the thrust force command values to the first and second driving parts, so that the distribution value obtained by distributing the thrust force command values for the first and second driving parts by a changing ratio corresponding to the position of the center of gravity of the moving body unit and the moments in the rotational direction due to the thrust forces of the first and second driving parts can be balanced. As a result of this, it is possible to prevent the rotational force from acting on the first moving body (first stage). Therefore, the first moving body (first stage) can be translated (moved in a straight line ) where there is no inclination in the yawing direction.

In addition, according to the above-mentioned the position control device of the moving body, the stage device using the position control device, or the position control method of the moving body, the moment of inertia in the rotational direction wherein the position of the center of gravity of the moving body unit that changes corresponding to the moving position of the second moving body (second stage) is an axis can be calculated and the thrust force around the axis of the center of gravity can be calculated so that the moment of inertia can be constant. Therefore, the control loop gain of the control system in the rotational direction can be kept constant by the control system and the control capability of the control system in the rotational direction cannot be changed regardless of the moving position of the second moving body (second stage). Hence, it is possible to stably translate the first moving body (first stage).

Other objects, features, and advantages of the present invention will become more apparent from the following detailed description when read in conjunction with the accompanying drawings.

DETAILED DESCRIPTION OF THE PREFERRED EMBODIMENT

A description will now be given, with reference to FIG. 1 through FIG. 8, of embodiments of the present invention.

Figure 1:
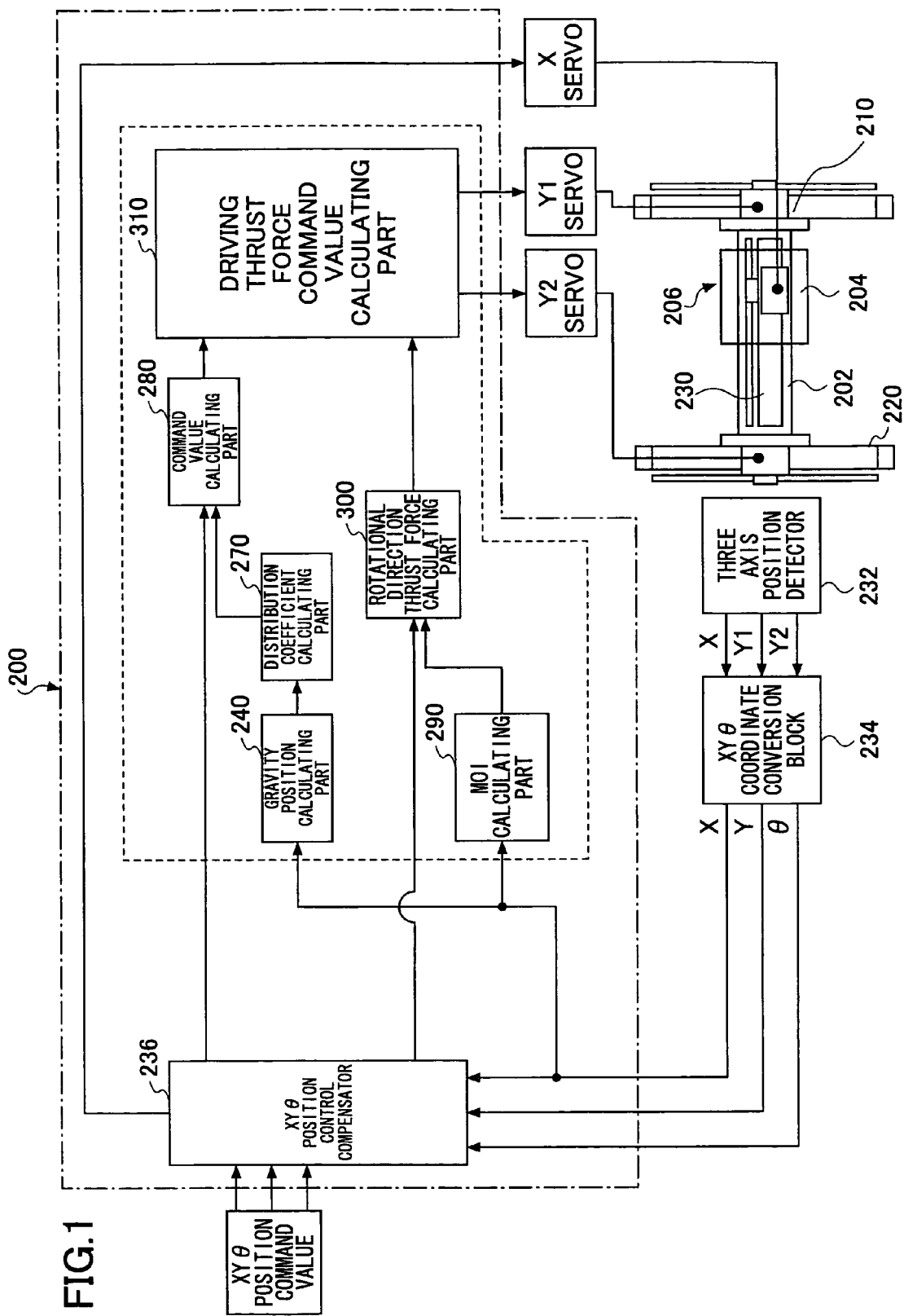
FIG. 1 is a block diagram showing structural elements of a position control device of a moving body of an embodiment of the present invention.

FIG. 1 is a block diagram showing structural elements of a position control device of a moving body of an embodiment of the present invention. As shown in FIG. 1, a position control device 200 of a moving body controls a first driving part 210, a second driving part 220, and a third driving part 230. The first and second driving parts 210 and 220 drives corresponding ends of a first moving body (Y1 stage) 202 so as to move the first moving body 202 in a Y direction. The third driving part 230 drives a second moving body (X stage) 204. The second moving body moves in an X direction perpendicular to the Y direction.

A coordinate position of a moving unit 206 including the first moving body 202 and the second moving body 204 is detected by a three axis position detector 232. The coordinate position of the moving unit 206 is converted to an XYθ control coordinate system by a coordinate conversion block 234 and supplied to an XYθ position control compensator 236 as a position feedback value.

The position control device 200 of the moving body includes the XYθ position control compensator 236, a COG (center of gravity) position calculating part 240, and a distribution coefficient calculating part 270. The XYθ position control compensator 236 calculates a thrust force target value. The COG position calculating part 240 calculates a position of the center of gravity of the moving unit 206 that includes the first moving body 202 and the second moving body 204, the position of the center of gravity corresponding to a moving position X of the second moving body 204. The distribution coefficient calculating part 270 calculates a distribution coefficient for setting a distribution ratio of the thrust force of the first driving part 210 and the thrust force of the second driving part 220 corresponding to the position of the center of gravity calculated by the COG position calculating part 240.

In addition, the position control device 200 of the moving body includes a command value calculating part 280. The command value calculating part 280 multiplies the distribution coefficient calculated by the distribution coefficient calculating part 270 and Y axis (first axis) thrust force target values of the first and second driving parts 210 and 220 calculated by the XYθ position control compensator 236 together so as to calculate Y axis (first axis) thrust force command values (distribution values) for the first and second driving parts 210 and 220, and thereby moments of forces in the rotational directions by the thrust forces of the first and second driving parts 210 and 220 acting around an axis of a center of gravity become balanced.

The position control device 200 of the moving body also includes an MOI (moment of inertia) calculating part 290 and a rotational direction thrust force calculating part 300. The MOI calculating part 290 calculates a moment of inertia around the Z axis of the moving unit 206 that changes corresponding to a moving position X of the second moving body 204. The moment of inertia calculated by the MOI calculating part 290 and a θ axis (third axis) thrust force target value calculated by the XYθ position control compensator 236 are input to the rotational direction thrust force calculating part 300. The rotational direction thrust force calculating part 300 calculates a θ axis (third axis) thrust force command value around the Z axis, namely in the rotational direction, so that the ratio of the moment of inertia to a thrust force gain of the position control compensator 236 in the rotational direction is constant.

In addition, the position control device 200 of the moving body includes a driving thrust force command value calculating part 310. The driving thrust force command value calculating part 310 calculates driving thrust force command values (Y1 motor estimating command value and Y2 motor estimating command value) for the first and second driving parts 210 and 220 based on a Y axis thrust force command value calculated by the command value calculating part 280 and a θ axis estimated command value calculated by the rotational direction thrust force calculating part 300.

The distribution coefficient calculating part 270 calculated distributed thrust force command values $f_1$ and $f_2$ based on the following formulas. That is, $$f_1 = (-\alpha x + g_{10}) \cdot f^* + (\beta x + h_0) \cdot \tau^*$$

$$f_2 = (\alpha x + g_{20}) \cdot f^* - (\beta x + h_0) \cdot \tau^*$$

Here, "$f_1$" and "$f_2$" denote thrust force command values for the first driving part 210 and the second driving part 220, respectively. "x" denotes a position measuring value of the second moving body 204 moving in a biaxial direction. "$g_{10}$" and "$g_{20}$" denote ratio of thrust force command distribution in a first axis translation direction for a moment of a force around the center of gravity of the moving body unit 206 in a case of "x=0". "α" denotes a changing ratio, due to change of "x", of the distance between the center of gravity of the moving body and the first and second driving parts 210 and 220. "$h_0$" denotes a thrust force gain of a rotational direction position control loop around the third axis (z axis) passing through the center of gravity in the case of "x=0". "β" denotes a changing ratio, due to change of "x", of a moment of inertia in a direction around the third axis passing through the center of gravity of the entirety of the moving body. "f*" denotes a translation direction thrust force command value in the first axis direction. "τ*" denotes a thrust force command value to the rotational direction around the third axis. Explanation for the above-mentioned formulas is discussed below.

Therefore, in the position control device 200 of the moving body, a rotational force due to a thrust force of the first driving part 210 and a rotational force due to a thrust force of the second driving part 220 in rotational directions (θ directions) acting around the Z axis of the center of gravity of the moving body unit 206 corresponding to the position of the center of gravity calculated by the COG position calculating part 240 are determined. The distribution ratio of the thrust force of the first driving part 210 and the thrust force of the second driving part 220 is set so that two rotational forces acting in opposite directions from each other are balanced. As a result of this, since the rotational force is not applied to the first moving body (first stage) 202, it is possible to drive the first moving body (first stage) 202 in a translation manner in a state where there is no inclination in the yawing direction.

Figure 2:
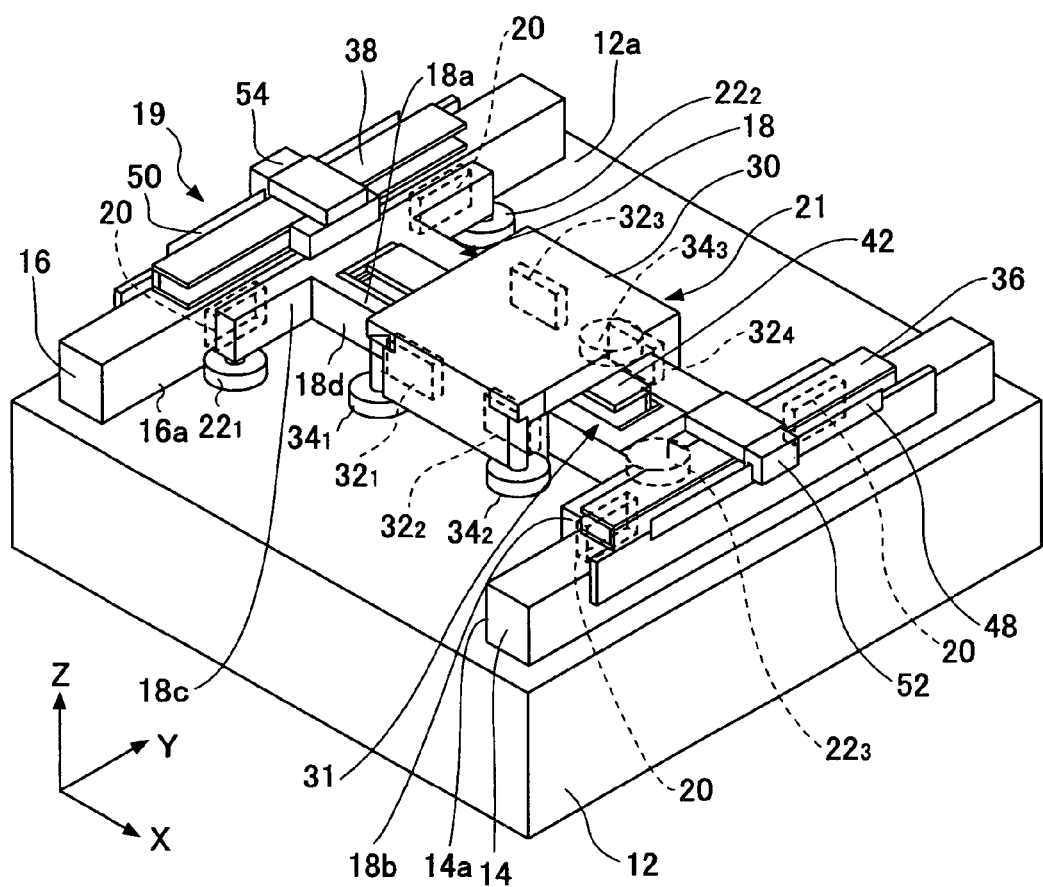
FIG. 2 is a perspective view of a stage device where the position control device of the moving body of the embodiment of the present invention is applied.

Next, a concrete example of the present invention is discussed below. FIG. 2 is a perspective view of a stage device where the position control device of the moving body of the embodiment of the present invention is applied.

As shown in FIG. 2, a stage device 10 includes a base 12, a pair of guide rails 14 and 16, a Y stage (first moving body) 18, a Y direction driving part 19, an X stage (second moving body) 30, and an X direction driving part 31. The guide rails 14 and 16 are fixed on the base 12. The Y direction driving part 19 drives the Y stage 18 in the Y direction. The X direction driving part 31 drives the X stage 30 in the X direction. The X stage 30 is movably provided at the Y stage 18. The X stage 30 and the Y stage 18 form a moving body unit 21.

The base 12 has an upper surface 12a as a static pressure bearing guiding surface configured to guide horizontal movement of the moving body unit 21. In addition, the guide rails 14 and 16 have Y direction guiding surfaces 14a and 16a configured to guide corresponding ends of the Y stage 18. The Y direction guiding surfaces 14a and 16a are formed as side surfaces of the guide rails 14 and 16, respectively, facing each other.

The Y stage 18 bridges between the guide rails 14 and 16. The Y stage 18 includes a main body 18a and slide parts 18b and 18c. The main body 18a slides along the upper surface 12a of the base 12 in the Y direction. The slide parts 18b and 18c are provided at corresponding ends of the main body 18a and are guided in linear motion along the Y direction guiding surfaces 14a and 16a of the guide rails 14 and 16 in the Y direction.

If the slide parts 18b and 18c have the same configuration, the position of the center of gravity of the y stage 18 is at an intermediate position in the Y direction. If the slide parts 18b and 18c have different configurations from each other, since the mass of the slide part 18b is different from the mass of the slide part 18c, the position of the center of gravity of the y stage is shifted at a designated distance from the intermediate position in the Y direction due to the difference of the masses of the slide parts 18b and 18c.

The Y stage 18 also includes four static pressure air bearing pads 20 and three static pressure air bearing pads $22_1$ through $22_3$. The static pressure air bearing pads 20 are provided on side surfaces of the slide parts 18b and 18c. The static pressure air bearing pads 22 are provided on lower surfaces of the slide parts 18b and 18c. The static pressure air bearing pads 20 and $22_1$ through $22_3$ are held on side surfaces of the slide parts 18b and 18c of the Y stage 18 via four joints (not shown in FIG. 2) that have one degree of rotational freedom around the Z axis perpendicular to an X-Y plane surface on the base 12.

The static pressure air bearing pad $22_3$ is provided at a part corresponding to a center axis in the X direction of the Y stage 18. The static pressure air bearing pads $22_1$, and $22_2$ are provided in positions that are substantially symmetric in the Y direction about the X-direction center axis of the Y stage 18. In other words, the static pressure air bearing pads $22_1$ through $22_3$ are arranged so that the centers of the static pressure air bearing pads $22_1$ through $22_3$ form an isosceles triangle configuration.

In addition, as discussed above, the X stage 30 is movably provided at the Y stage 18 in the X direction perpendicular to the Y direction. The Y stage 18 has front and rear side surfaces 18d and 18e as X direction guiding surfaces configured to guide the X stage 30 in the X direction. The front and rear side surfaces 18d and 18e are situated in parallel with an extending direction of the Y stage 18.

The X stage 30 is formed in a rectangular box configuration without a bottom in the X-Y plane and without side walls in the Y-Z plane so as to straddle the upper surface and the front and rear surfaces of the Y stage 18. The X stage 30 includes four static pressure air bearing pads $32_1$ through $32_4$ and three static pressure air bearing pads $34_1$ through $34_3$. The static pressure air bearing pads $32_1$ through $32_4$ face the front and rear side surfaces 18d and 18e of the Y stage 18.

The static pressure air bearing pads $34_1$ through $34_3$ face the upper surface $12a$ of the base 12.

The static pressure air bearing pads 20 and $22_1$ through $22_3$ form minute air layers on the upper surface $12a$ of the base 12 and the guide rails 14 and 16 by jetting compressed air. The static pressure air bearing pads 20 and $22_1$ through $22_3$ guide and support the Y stage 18 with these air layers so that frictional resistance is almost zero.

Furthermore, the static pressure air bearing pads $32_1$ through $32_4$ and $34_1$ through $34_3$ form minute air layers on the upper surface $12a$ of the base 12 and the front and rear side surfaces of the Y stage 18 by jetting compressed air. The static pressure air bearing pads $32_1$ through $32_4$ and $34_1$ through $34_3$ guide and support the X stage 30 with these air layers so that frictional resistance is almost zero.

The Y direction driving part 19 includes a Y1 linear motor (first driving part) 36 provided on the guide rail 14 and a Y2 linear motor (second driving part) 38 provided on the guide rail 16. The Y1 linear motor 36 and the Y2 linear motor 38 include magnet units (not shown in FIG. 2) arranged so as to be extended in the Y direction and coil units (not shown in FIG. 2) arranged so as to face the magnet units. Cable pairs (not shown in FIG. 2) are connected to the coil units.

The X direction driving part 31 includes an X linear motor (third driving part) 42 provided on the main body $18a$ of the Y stage 18. The X linear motor 42 include a magnet unit (not shown in FIG. 2) arranged so as to be extended in the X direction and a coil unit (not shown in FIG. 2) arranged so as to face the magnet unit. A cable pair (not shown in FIG. 2) is connected to the coil unit.

A Y1 linear scale 48 and a Y2 linear scale 50 formed so as to be extended in the Y direction, a Y1 linear encoder (Y1 position detector) 52, and a Y2 linear encoder (Y2 position detector) 54 are provided on the guide rails 14 and 16, respectively. The Y1 linear encoder (Y1 position detector) 52 and the Y2 linear encoder (Y2 position detector) 54 are provided at the Y stage 18 so as to detect relative positions of the Y1 linear scale 48 and the Y2 linear scale 50.

Because of this, moving positions of the slide parts $18b$ and $18c$ of the Y stage 18 are detected by calculating the pulse number being output from the Y1 linear encoder 52 and the Y2 linear encoder 54. In addition, a rotational angle θ of the Y stage 18 is detected by the difference between the pulse number being output from the Y1 linear encoder 52 and the pulse number being output from the Y2 linear encoder 54.

In addition, an X linear scale (not shown in FIG. 2) extending in the X direction and an X linear encoder (not shown in FIG. 2) provided at the X stage 30 and configured to detect a relative position against the X linear scale are provided on the main body $18a$ of the Y stage 18. Because of this, the moving position of the X stage 30 is detected by calculating the pulse number being output from the X linear encoder (X position detector).

In the stage device 10 having the above discussed structure, the Y1 linear motor 36 and the Y2 linear motor 38 are controlled so that, if the slide parts $18b$ and $18c$ provided at both ends of the Y stage 18 are simultaneously driven in a translational manner by the Y1 linear motor 36 and the Y2 linear motor 38, as long as the X stage 30 is positioned in the center in the X direction, both thrust forces become equal.

In the Y stage 18 driven in a translational manner by the Y1 linear motor 36 and the Y2 linear motor 38, a rotational motion (yawing motion) around the Z axis at the time of moving may be caused. This may be because of difference of loads (disturbance) of the cables (not shown in FIG. 2) connected to both ends of the Y stage 18 or forces in the rotational direction generated due to change of the thrust forces applied by the Y1 linear motor 36 and the Y2 linear motor 38.

Here, movement of the Y stage 18 of the stage device having the above-discussed structure is discussed.

Figure 3:
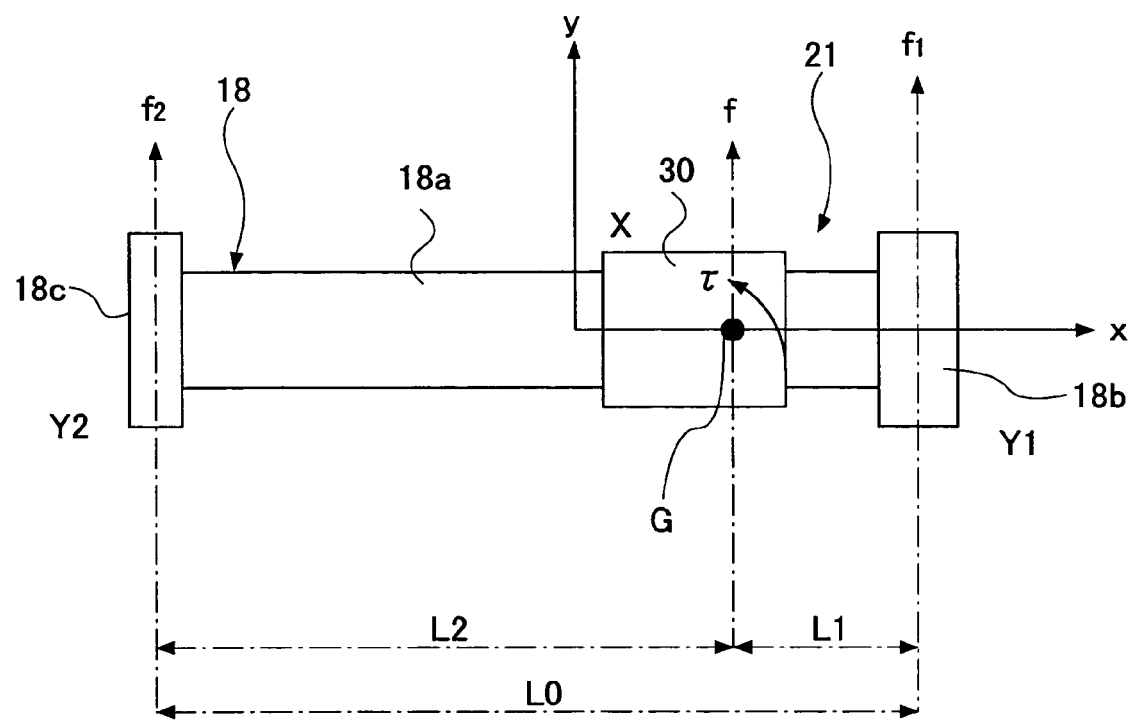
FIG. 3 is a simplified plan view of a Y stage 18 and an X stage 30 shown in FIG. 2.

FIG. 3 is a simplified plan view of the Y stage 18 and then X stage 30 shown in FIG. 2.

As shown in FIG. 3, in the stage device 10, since the X stage 30 is movably provided at the Y stage 18, the position of the center of gravity of the moving body unit 21 is moved in the X direction by moving the X stage 30 in the X direction.

In addition, the moment of inertia in the rotational direction (yawing direction) around the Z axis and passing through the center of gravity point G is changed. This moment of inertia can be expressed as a function of X coordinate, namely J(x).

In this case where "f*" denotes a y direction translation propulsion command of a Y direction control system; "τ*" denotes a yawing torque command of a θ direction control system; and "$f_1$" and "$f_2$" denote thrust forces (driving forces) of the Y1 and Y2 linear motors 36 and 38 for driving in the Y direction. At this time, "f*" and "τ*" are distributed to the thrust forces "$f_1$" and "$f_2$" based on a formula (1) below so that thrust force decoupling is made in order to prevent mutual interference between the thrust forces "$f_1$" and "$f_2$".

$$\begin{bmatrix} f_1 \\ f_2 \end{bmatrix} = \begin{bmatrix} g_1 & h_1 \\ g_2 & h_2 \end{bmatrix} \begin{bmatrix} f^* \\ \tau^* \end{bmatrix} \quad (1)$$

Here, distances between the position of the center of gravity corresponding to the moving position of the X stage 30 and driving points where thrust forces of the Y1 and Y2 linear motors 36 and 38 are generated are denoted as "$L_1(x)$" and "$L_2(x)$".

Based on the thrust forces "$f_1$" and "$f_2$" being calculated by the above-mentioned formula (1), a translation thrust force "f" acting on the center of gravity of the moving body unit 21 and a yawing torque "τ" are calculated by a formula (2) below.

$$\begin{bmatrix} f \\ \tau \end{bmatrix} = \begin{bmatrix} 1 & 1 \\ L_1(x) & -L_2(x) \end{bmatrix} \begin{bmatrix} f_1 \\ f_2 \end{bmatrix} \quad (2)$$

Here, $$L_1(x) + L_2(x) = L_0 \quad (3)$$

Thus, the relationship between a command thrust force of a control system and the translation thrust force "f" acting on the center of gravity of the moving body unit 21 and the yawing torque "τ" is expressed by a formula (4) below.

$$\begin{bmatrix} f \\ \tau \end{bmatrix} = \begin{bmatrix} 1 & 1 \\ L_1(x) & -L_2(x) \end{bmatrix} \begin{bmatrix} g_1 & h_1 \\ g_2 & h_2 \end{bmatrix} \begin{bmatrix} f^* \\ \tau^* \end{bmatrix} \quad (4)$$

$$= \begin{bmatrix} g_1 + g_2 & h_1 + h_2 \\ L_1(x)g_1 - L_2(x)g_2 & L_1(x)h_1 - L_2(x)h_2 \end{bmatrix} \begin{bmatrix} f^* \\ \tau^* \end{bmatrix}$$

Here, conditions for decoupling the Y-θ control system, that is, conditions for preventing a thrust force command "f*" of the Y direction control system from generating the yawing torque "τ" at the center of gravity of the moving body unit 21 and for preventing a yawing torque command "τ*" of the θ control system from generating the translation thrust force "f" at the center of gravity of the moving body unit 21, are making an off diagonal element of a determinant of a right side of the formula (4) be zero.

Therefore, the following formulas (5) and (6) are obtained.

$$h_1 = -h_2 \quad (5)$$

$$L_1(x)g_1 = L_2(x)g_2 \quad (6)$$

In addition, conditions for constantly keeping a control loop gain of a control system of the moving body unit 21 are obtained by making a value obtained by dividing the (1, 1) element of a determinant of a right side of the formula (4) by the mass of the moving body unit 21 and a value obtained by dividing the (1, 1) element of the determinant by the moment of inertia of the moving body unit 21 constant.

Since the mass of the moving body unit 21 is constant regardless of a coordinate position of the X stage 30, the above-mentioned conditions are expressed by formulas (7) and (8) below.

$$g_1 + g_2 \equiv g_0 = const \quad (7)$$

$$\frac{L_1(x)h_1 - L_2(x)h_2}{J(x)} \equiv \frac{L_0 h_0}{J_0} = const \quad (8)$$

Through the above-mentioned formulas (7) and (8), it is found that, in order to decouple the Y-θ control system and constantly keep the control system loop gain, the thrust forces "$f_1$" and "$f_2$" are distributed based on distribution coefficients "$g_1$", "$g_2$", "$h_1$", and "$h_2$" of formulas (9) through (12) below.

$$g_1 = \frac{L_2(x)}{L_0} g_0 \quad (9)$$

$$g_2 = \frac{L_1(x)}{L_0} g_0 \quad (10)$$

$$h_1 = \frac{J(x)}{J_0} h_0 \quad (11)$$

$$h_2 = \frac{J(x)}{J_0} h_0 \quad (12)$$

Following these formulas, it is clear that the distribution formulas of the thrust forces "$f_1$" and "$f_2$" are expressed by formulas (13) and (14) below.

$$f_1 = g_1 \times f^* + h_1 \times \tau^* \quad (13)$$
$$= \frac{L_2(x)}{L_0} g_0 \times f^* + \frac{J(x)}{J_0} h_0 \times \tau^*$$

$$f_2 = g_2 \times f^* + h_2 \times \tau^* \quad (14)$$
$$= \frac{L_1(x)}{L_0} g_0 \times f^* - \frac{J(x)}{J_0} h_0 \times \tau^*$$

Figure 4:
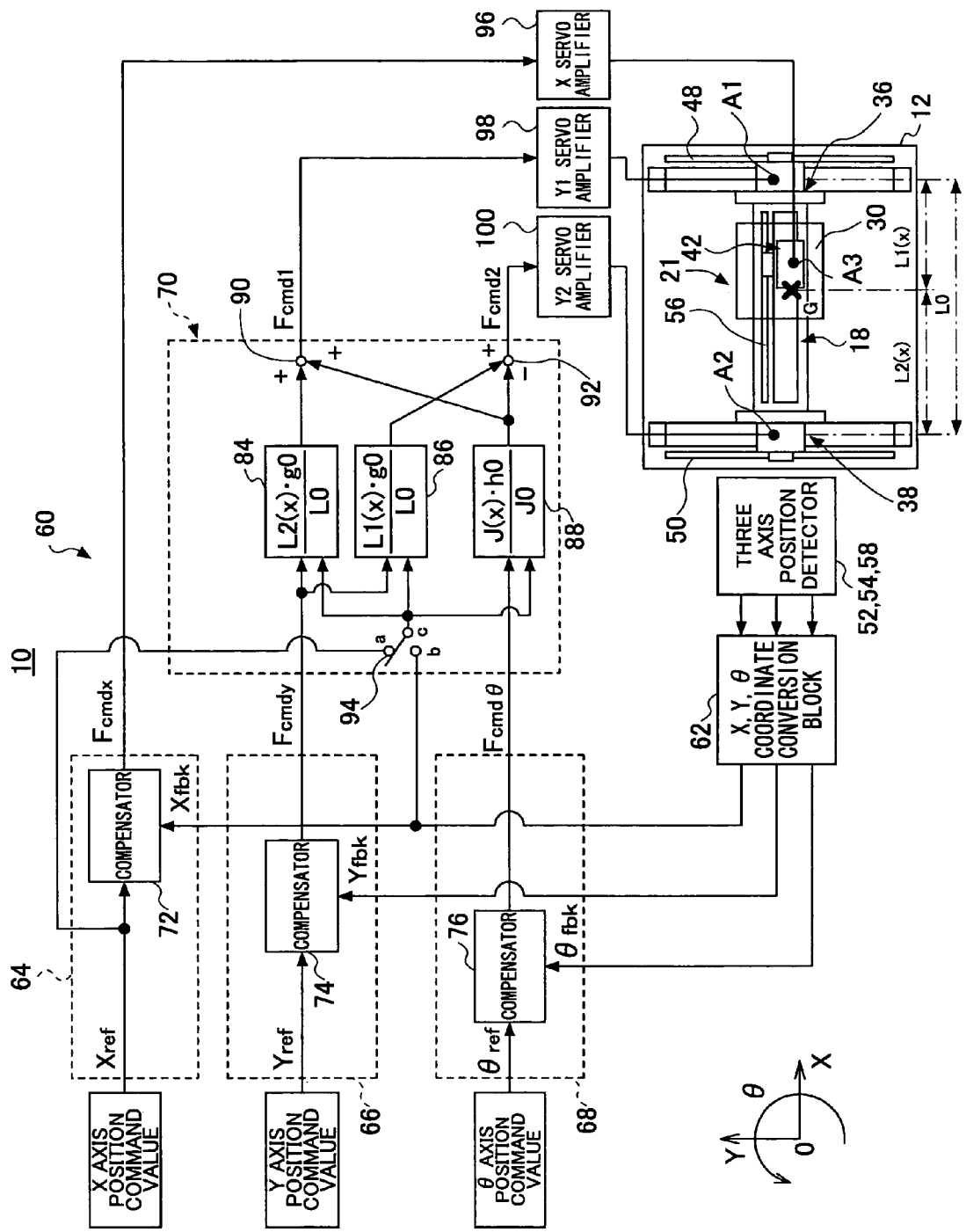
FIG. 4 is a schematic diagram of an example of a control system.

Here is an example of the control system for controlling the stage device 10 with reference to FIG. 4. FIG. 4 is a schematic diagram of the example of the control system.

As shown in FIG. 4, the control system 60 includes a coordinate conversion block 62 and an X control system block 64. When Y1, Y2, and X direction position signals detected by the above-mentioned Y1, Y2, and X linear encoders 52, 54, and 58 are input, the coordinate conversion block 62 implements X, Y and θ coordinate conversion, calculates the coordinate position in each of the directions and the position of the center of gravity, and generates feedback values. The X control system block 64 controls moving of the X stage 30.

In addition, the control system 60 includes a Y control system block 66, a θ control system block 68, and a thrust force decoupling block 70. The Y control system block 66 controls moving of the Y stage 18. The θ control system block 68 controls inclination in the θ direction of the moving body unit 21. The thrust force decoupling block 70 calculates the position of the center of gravity without interference of the thrust forces "$f_1$" and "$f_2$" of the Y1 and Y2 linear motors 36 and 38 so as to implement thrust force decoupling.

The coordinate conversion block 62 is a calculating part configured to calculate coordinate positions in the X direction, the Y direction and the θ direction of the moving body unit 21 corresponding to the moving position of the X stage 30. The coordinate conversion block 62 inputs an X direction feedback value $X_{fbk}$ to a compensator 72 of the X control system block 64, inputs a Y direction feedback value $Y_{fbk}$ to a compensator 74 of the Y control system block 66, and inputs a θ direction feedback value $θ_{fbk}$ to a compensator 76 of the θ control system block 68.

The compensator 72 of the X control system block 64 outputs an X axis thrust force target value $F_{cmdx}$ by using an X axis position command value $X_{ref}$ and an X direction feedback value $X_{fbk}$.

The compensator 74 of the Y control system block 66 outputs a Y axis thrust force target value $F_{cmdy}$ by using a Y axis position command value $Y_{ref}$ and an Y direction feedback value $Y_{fbk}$. The compensator 76 of the θ control system block 68 outputs a θ axis thrust force target value $F_{cmdθ}$ by using a θ axis position command value $θ_{ref}$ and a θ direction feedback value $θ_{fbk}$.

The thrust force decoupling block 70 is a thrust force distribution part configured to set a distribution ratio of the thrust force $f_1$ of the Y1 linear motor 36 to the thrust force $f_2$ of the Y2 linear motor 38 so that a rotational force by the thrust force $f_1$ of the Y1 linear motor 36 acting around the axis of the center of gravity of the Y stage corresponding to the position of the center of gravity of the moving body unit 21 and a rotational force by the thrust force $f_2$ of the Y2 linear motor 36 are balanced. The thrust force decoupling block 70 includes first through third distribution calculating parts 84, 86, and 88, an adder 90, a subtracter 92, and a switch 94.

The first through third distribution calculating parts 84, 86, and 88 comprises a distribution coefficient calculating part and a command value calculating part. The distribution coefficient calculating part calculates distribution coefficients for distributing the thrust forces of the Y1 and Y2 linear motors 36 and 38 corresponding to the position of the center of gravity. The command value calculating part multiplies the distribution coefficient by the thrust force target value so as to calculate the thrust force command value.

The adder 90 and the subtracter 92 are command value calculating parts configured to calculate the command values of the Y1 and Y2 linear motors 36 and 38 from the thrust force command values calculated by the first through third distribution calculating parts 84, 86, and 88.

The switch 94 is a switching part configured to selectively input the X axis position command value $X_{ref}$ or the X direction feedback value $X_{fbk}$ to the first through third distribution calculating parts 84, 86, and 88. The switch 94 connects a contact "a" or a contact "b" to a contact "c" based on which, the X axis position command value $X_{ref}$ or the X direction feedback value $X_{fbk}$, has priority. In addition, the switch 94 may be switched by a manual operation or automatically based on a preset condition (threshold value).

For example, in the first through third distribution calculating parts 84, 86, and 88, when the distribution coefficient is based on the X axis position command value $X_{ref}$ not including a vibration element, as shown in FIG. 3, the switch 94 is switched so that the contact "a" and the contact "c" are connected to each other. When the distribution coefficient is based on the X direction feedback value $X_{fbk}$, the switch 94 is switched so that the contact "b" and the contact "c" are connected to each other.

The Y axis thrust force target value $F_{cmdy}$ generated by the compensator 74 of the Y control system block 66 is input to the first and second distribution calculating parts 84 and 86. The θ axis thrust force target value $\theta_{cmd\theta}$ generated by the compensator 76 of the θ control system block 68 is input to the third distribution calculating parts 88.

An estimating command value $g_{10}$ generated by the first distribution calculating part 84 and a θ axis thrust force command value $h_0$ generated by the third distribution calculating part 88 are added by the adder 90 so as to be the Y1 linear motor thrust force command value $F_{cmd1}$, and are amplified by a Y1 servo amplifier 98 so as to be input to the Y1 linear motor 36.

In addition, an estimating command value $g_{20}$ generated by the second distribution calculating part 86 and the θ axis thrust force command value $h_0$ generated by the third distribution calculating part 88 are subtracted by the subtracter 92 so as to be the Y2 linear motor thrust force command value $F_{cmd2}$, and are amplified by a Y2 servo amplifier 100 so as to be input to the Y2 linear motor 38.

The X axis thrust force target value $F_{cmdx}$ output from the compensator 72 of the X control system block 64 is amplified by an X servo amplifier 96 so as to be input to an X linear motor 42.

Thus, in the stage device 10, by implementing the thrust force decoupling by the thrust force decoupling block 70 so that the thrust forces $f_1$ and $f_2$ do not interfere with each other, it is possible to set the distribution ratio of the thrust force of the Y1 linear motor 36 to the thrust force of the Y2 linear motor 38, so that the rotational moment due to the thrust force of the Y1 linear motor 36 and the rotational moment due to the thrust force of the Y2 linear motor 38 in the rotational directions acting around the axis of the center of gravity balance each other. As a result of this, it is possible to prevent the rotational force from being applied to the Y stage 18 regardless of the position of the X stage 30 so that the Y stage 18 can be driven without inclination in the yawing direction.

Figure 5:
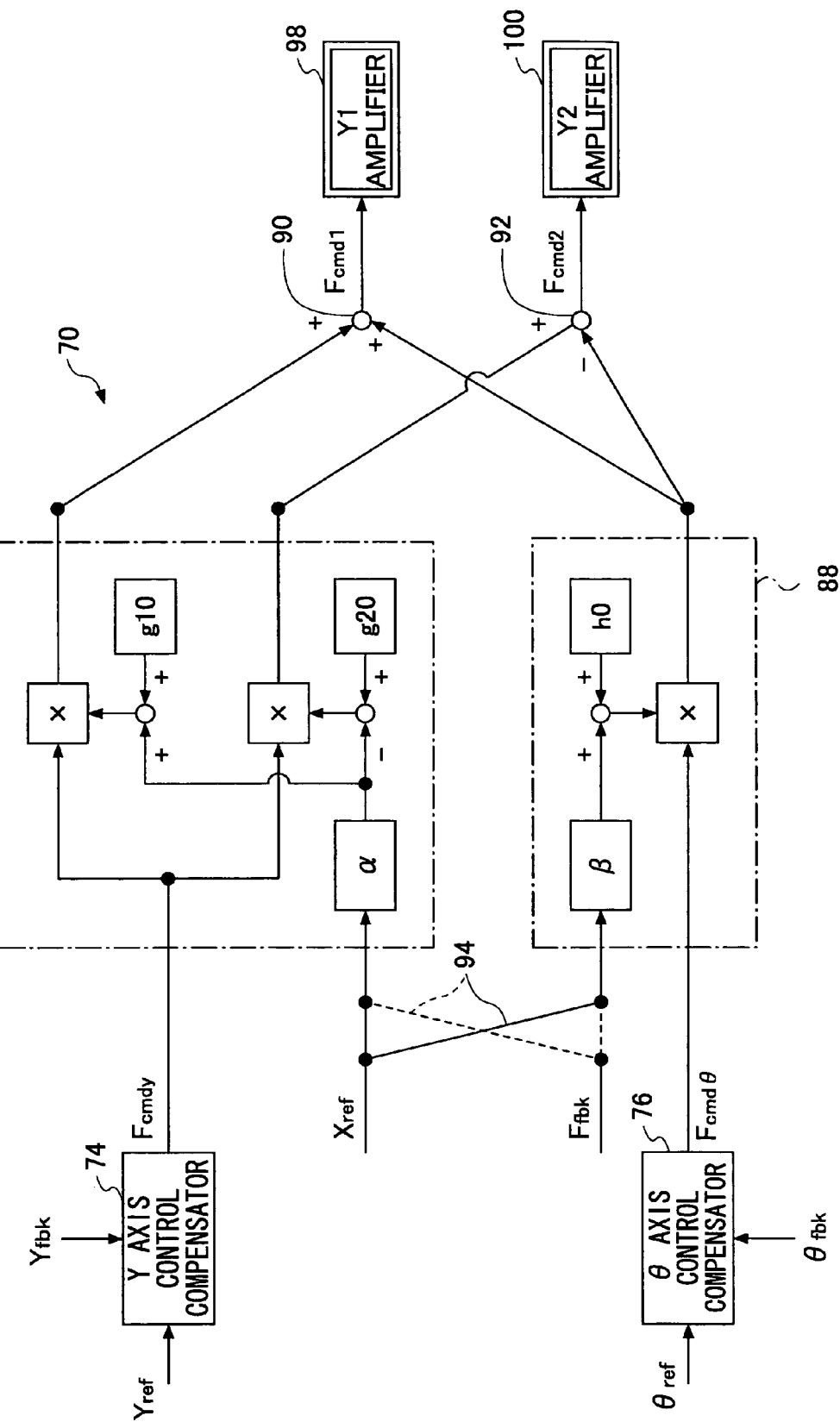
FIG. 5 is a diagram showing an example of a control system of a thrust force decoupling control block 70.

FIG. 5 is a diagram showing an example of a control system of the thrust force decoupling control block 70.

As shown in FIG. 5, position command values of the X axis, the Y axis, and the θ axis are respectively denoted "$X_{ref}$", "$Y_{ref}$" and "$\theta_{ref}$". The coordinate positions of the Y stage 18 and the X stage 30 are detected as position feedback values "$X_{fbk}$", "$Y_{fbk}$" and "$\theta_{fbk}$" by converting the stage positions detected by the Y1 linear encoder 52, the Y2 linear encoder 54, and the X linear encoder 58 as the position detectors of the three axes to the XYθ control coordinate system by the coordinate conversion block 62.

The X control system block 64, the Y system control block 66, and the θ control system block 68 calculate the thrust force target values "$F_{cmdx}$", "$F_{cmdy}$" and "$F_{cmd\theta}$" of the axis directions from the position command values "$X_{ref}$", "$Y_{ref}$" and "$\theta_{ref}$" and the position feedback values "$X_{fbk}$", "$Y_{fbk}$" and "$\theta_{fbk}$", respectively. The thrust force command value of the Y direction and the θ direction are distributed to the Y1 linear motor thrust force command values "$F_{cmd1}$" and the Y2 linear motor thrust force command values "$F_{cmd2}$" by the thrust force decoupling block 70.

Next, a calculating method of coefficients of distribution calculated by the distribution calculating parts 84 and 86 is discussed.

In the above-mentioned formula (9), the coefficient "$g_1$" of distribution is calculated by multiplying a ratio of distance $L_2(x)$ from the position of the center of gravity of the moving body unit 21 calculated from the X direction position to a driving point A2 of the Y2 linear motor 38 and distance $L_0$ between the Y1 linear motor 36 and the Y2 linear motor 38 by a constant "$g_0$".

In the above-mentioned formula (10), the coefficient "$g_2$" of distribution is calculated by multiplying the ratio of the distance $L_1(x)$ from the position of the center of gravity of the moving body unit 21 calculated from the X direction position to a driving point A1 of the Y1 linear motor 36, and distance $L_0$ between the Y1 linear motor 36 and the Y2 linear motor 38, by a constant "$g_0$".

In the above-mentioned formula (11), the coefficient "$h_1$" of distribution is calculated by multiplying a ratio of the moment $J(x)$ of inertia in the yawing direction around the center of gravity of the moving body unit 21 calculated from the X direction position of the X stage 30 and the moment $J_0$ of inertia in the yawing direction around the center of gravity of the moving body unit 21 when the center of gravity of the moving body 21 is in the center between the Y1 linear motor 36 and the Y2 linear motor 38, by a constant "$h_0$". In addition, the coefficient "$h_2$" of distribution is equal to the coefficient "$-h_1$" of distribution.

Calculation examples of the coefficients of distribution are as follows. When the distance $L_1(x)$, the distance $L_2(x)$ and the moment $J(x)$ of inertia are linear, the following formulas (15) through (17) are formed.

$$L_1(x) = ax + L_{10} \tag{15}$$

$$L_2(x) = -ax + L_{20} \tag{16}$$

$$J(x) = bx + J_0 \tag{17}$$

Following formulas (18) through (21) are obtained by substituting the formulas (15) through (17) in the formulas (9) through (12).

$$g_1 = \frac{-ax + L_{20}}{L_0} g_0 = -\alpha x + g_{10} \tag{18}$$

$$g_2 = \frac{ax + L_{10}}{L_0} g_0 = \alpha x + g_{20} \tag{19}$$

$$h_1 = \frac{bx + J_0}{J_0} h_0 = \beta x + h_0 \tag{20}$$

$$h_2 = -\frac{bx + J_0}{J_0} h_0 = -(\beta x + h_0) \tag{21}$$

The thrust force decoupling block 70 using coefficients "α", "β", "$g_{10}$", "$g_{20}$" and "$h_0$" of the above-mentioned formulas (9) through (12) is shown in FIG. 5. By substituting the above-mentioned formulas (18) through (21) to the above-mentioned formulas (13) and (14), distribution of the thrust force command values "$f_1$" and "$f_2$" are expressed as follows.

$$f_1 = (-\alpha x + g_{10}) \cdot f^* + (\beta x + h_0) \cdot \tau^* \qquad (22)$$

$$f_2 = (\alpha x + g_{20}) \cdot f^* - (\beta x + h_0) \cdot \tau^* \qquad (23)$$

Therefore, the thrust force command values "$f_1$" and "$f_2$" are distributed based on the formulas (22) and (23).

Thus, according to the stage device 10, even if the center of gravity of the moving body unit 21, due to adjusting the X stage 30 and the Y stage 18, is not consistent with the intermediate position, namely half way between the driving centers of the Y1 and Y2 linear motors 36 and 38, it is possible to prevent rotation in the θ direction (yawing direction) of the Y stage 18. The rotation is prevented by making correction led from a decoupling condition with two degrees of freedom (Y direction and θ direction) whereby the moment of the force in the θ direction generated by the Y direction thrust force, namely the yawing direction torque, is made zero and a control loop gain constant condition of the yawing direction inertia moment changes around the center of gravity of the moving body unit 21. Because of this, since the rotational force in the θ direction, namely the yawing direction, does not act on the Y stage 18, it is possible to translate the Y stage 18 with no inclination in the yawing direction.

In addition, in the stage device 10, since the control loop gain of the θ control system is kept constant by the control system 60, regardless of the moving position of the X stage 30, the control capability of the θ control system is not changed and it is possible to stably translate the Y stage 18.

Here, results of experiments in cases where the thrust forces $f_1$ and $f_2$ of the Y1 and Y2 linear motors 36 and 38 are controlled by the above-discussed thrust force decoupling block 70 are discussed with reference to FIG. 6 through FIG. 8.

Figure 6:
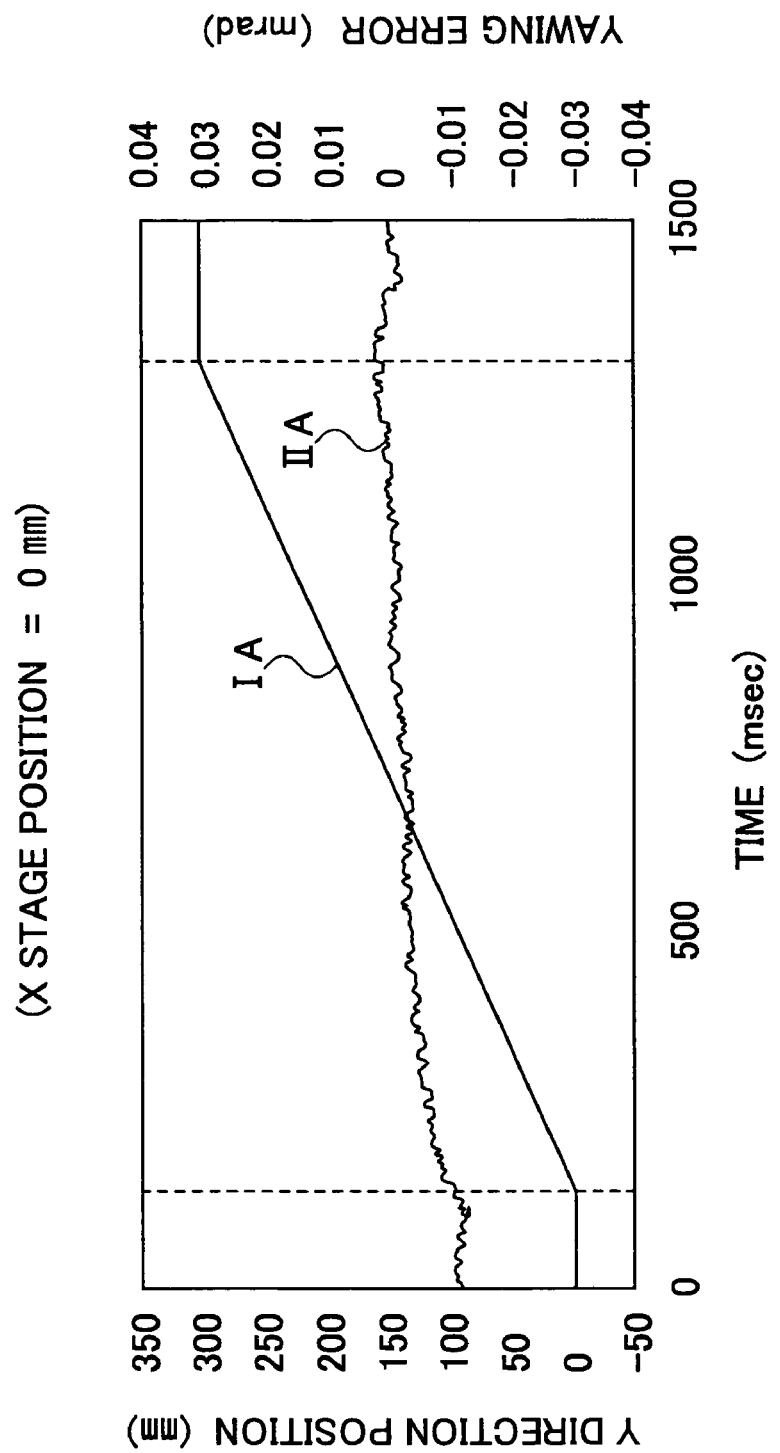
FIG. 6 is a graph showing a result of experiment where thrust forces $f_1$ and $f_2$ of Y1 and Y2 linear motors 36 and 38 are controlled by the thrust force decoupling control block 70 and the Y stage 18 is moved in a Y direction in a state where and the X stage 30 is moved to a right end in an X direction.

FIG. 6 is a graph showing a result of an experiment where thrust forces $f_1$ and $f_2$ of Y1 and Y2 linear motors 36 and 38 are controlled by the thrust force decoupling control block 70 and the Y stage 18 is moved in a Y direction while the X stage 30 is moved to the right end in an X direction. In FIG. 6, a line $I_A$ represents moving positions in the Y direction of the Y stage 18 accompanying the passing of time and a line $II_A$ represents rotational angles in the θ direction (yawing direction) of the y stage 18.

Figure 7:
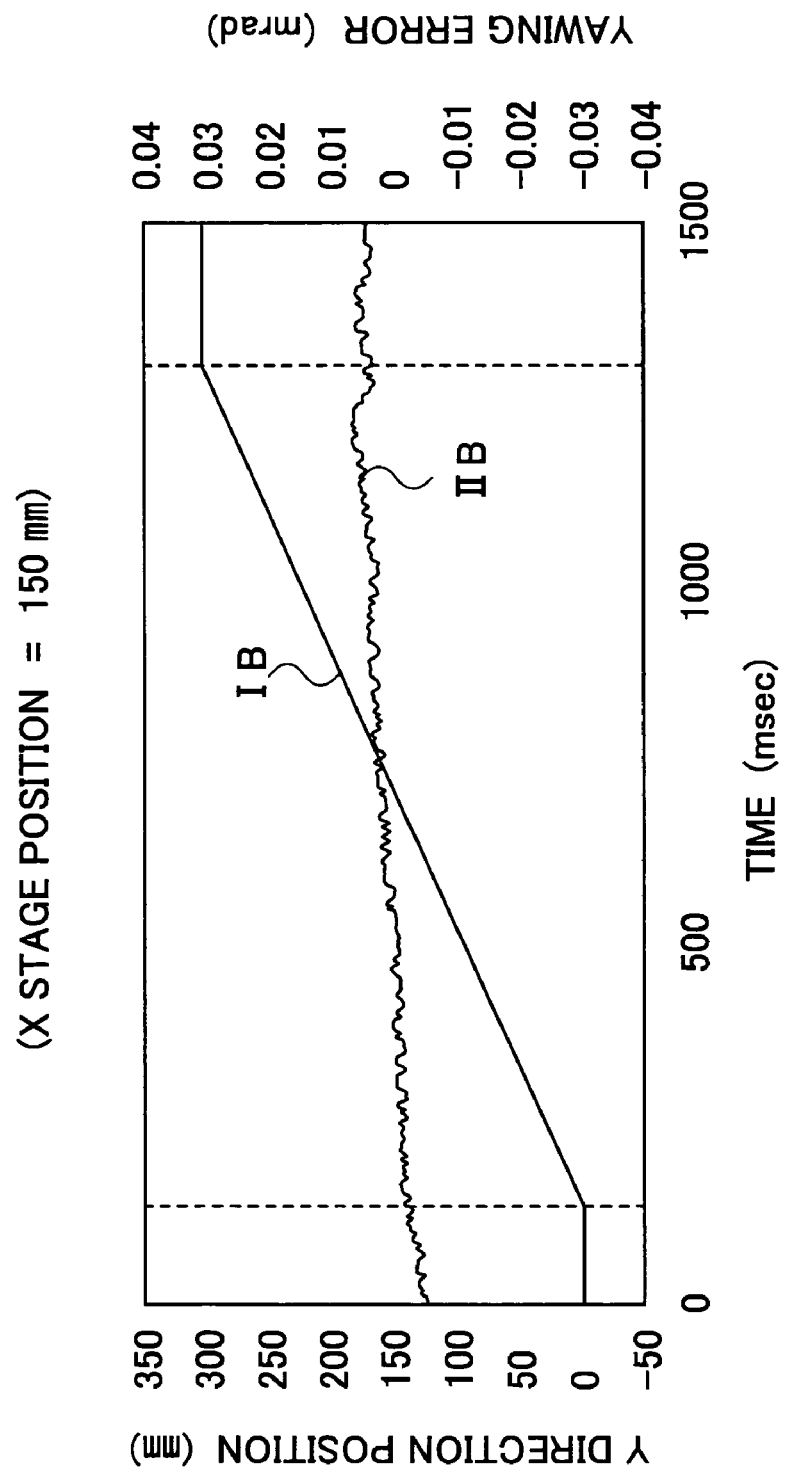
FIG. 7 is a graph showing a result of experiment where thrust forces $f_1$ and $f_2$ of Y1 and Y2 linear motors 36 and 38 are controlled by the thrust force decoupling control block 70 and the Y stage 18 is moved in the Y direction in a state where and the X stage 30 is moved to an intermediate position in the X direction.

FIG. 7 is a graph showing a result of an experiment where thrust forces $f_1$ and $f_2$ of Y1 and Y2 linear motors 36 and 38 are controlled by the thrust force decoupling control block 70 and the Y stage 18 is moved in the Y direction while the X stage 30 is moved to an intermediate position in the X direction. In FIG. 7, a line IB represents moving positions in the Y direction of the Y stage 18 accompanying the passing of time and a line IIB represents rotational angles of the θ direction (yawing direction) of the y stage 18.

Figure 8:
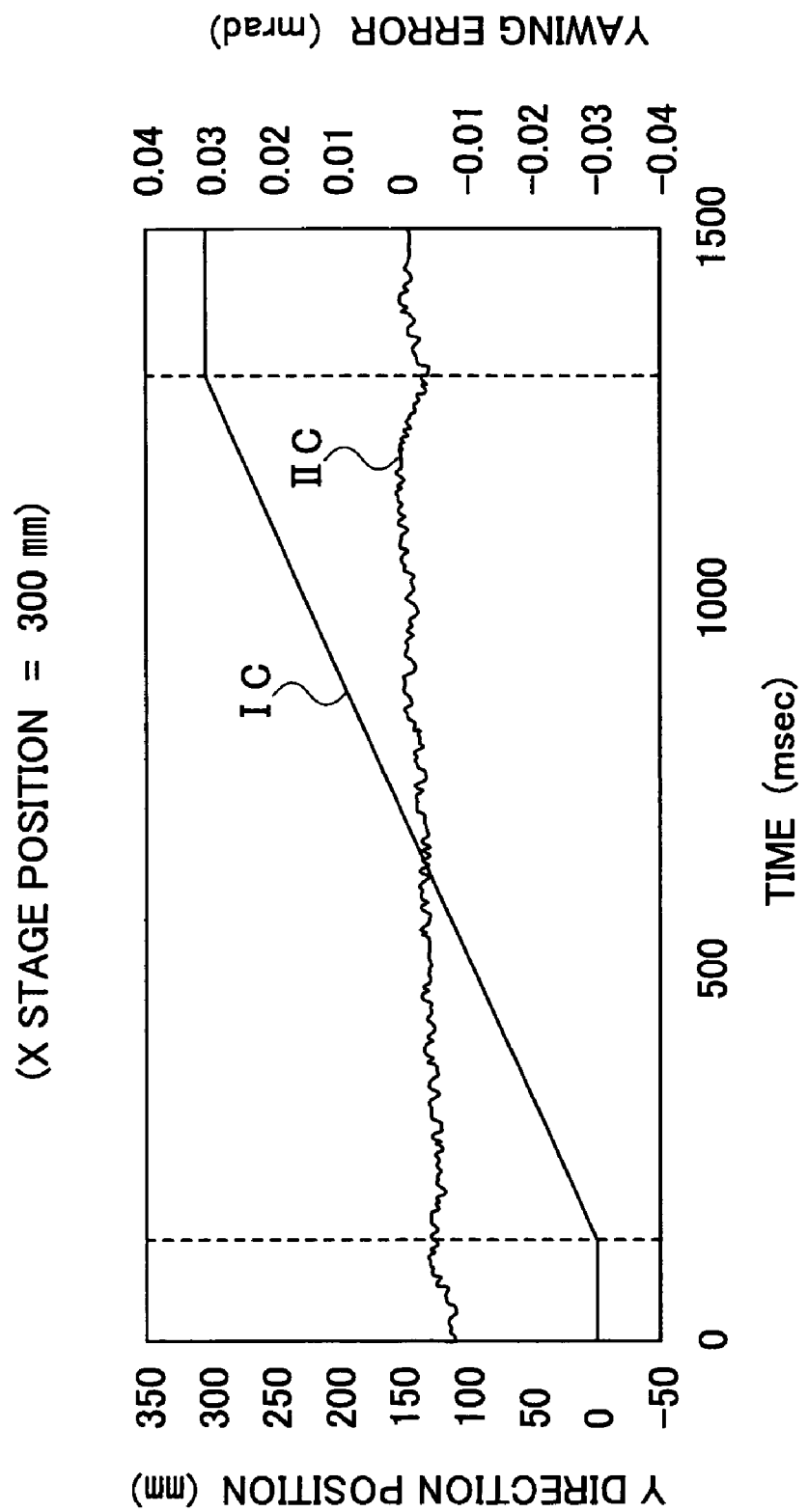
FIG. 8 is a graph showing a result of experiment where thrust forces $f_1$ and $f_2$ of Y1 and Y2 linear motors 36 and 38 are controlled by the thrust force decoupling control block 70 and the Y stage 18 is moved in the Y direction in a state where and the X stage 30 is moved to a left end in the X direction.

FIG. 8 is a graph showing a result of an experiment where thrust forces $f_1$ and $f_2$ of Y1 and Y2 linear motors 36 and 38 are controlled by the thrust force decoupling control block 70 and the Y stage 18 is moved in the Y direction while the X stage 30 is moved to the left end in the X direction. In FIG. 8, a line $I_C$ represents moving positions in the Y direction of the Y stage 18 accompanying the passing of time and a line $II_C$ represents rotational angles of the θ direction (yawing direction) of the y stage 18.

As shown in FIG. 7 and FIG. 8, regardless of the position of the X stage 30, change of the rotational angle in the θ direction (yawing direction) of the Y stage 18 is extremely minute and its range is approximately 0.005 through −0.005 mrad. Therefore, it is found that the Y stage 18 can be translated in a state where influence of he rotational force around the center of gravity of the moving body 21 and the change of the moment of inertia in the θ direction (yawing direction) due to the moving position of the X stage 30 is prevented by the thrust force decoupling block 70.

Thus, as discussed above, according to the embodiments of the present invention, it is possible to provide a position control device of a moving body, wherein first and second driving parts configured to drive corresponding ends of a first moving body movably provided in a first axial direction and a third driving part configured to drive a second moving body moving a second axial direction perpendicular to the first axial direction are controlled so that a moving body unit formed by the first moving body and the second moving body is moved, the position control device of the moving body including: a position of center of gravity calculating part configured to calculate a position of a center of gravity of the moving body unit corresponding to a moving position of the second moving body; a coefficient of distribution calculating part configured to calculate a coefficient of distribution setting a distribution ratio of a thrust force of the first driving part and a thrust force of the second driving part corresponding to the position of the center of gravity calculated by the position of center of gravity calculating part; a command value calculating part configured to multiply a first axis thrust force target value calculated by a position control compensator in the first axial direction by the coefficient of distribution calculated by the coefficient of distribution calculating part and configured to calculate a first axis thrust force command value of the first and second driving parts so that moments of forces in rotational directions due to the thrust forces on the first and second driving parts acting around the axis of the center of gravity are balanced; a moment of inertia calculating part configured to calculate a moment of inertia in a rotational direction wherein the position of the center of gravity of the moving body unit that changes corresponding to the moving position of the second moving body is an axis; a rotational direction thrust force calculating part configured to calculate a third axis thrust force command value around the axis of the center of gravity so that a ratio of the moment of inertia calculated by the moment of inertia calculating part to a thrust force gain of a position control compensator in the rotational direction is constant; and a driving thrust force command value calculating part configured to calculate thrust force command values for the first and second driving parts by using the first axis thrust force command value and the third axis thrust force command value, respectively.

In the position control device of the moving body, coordinate positions of the ends of the first moving body and a coordinate position of the second moving body may be detected by a three axis position detector; and the coordinate positions may be converted to the first and second axial directions and the rotational direction and supplied to the position control compensator as a position feedback value.

The coefficient of distribution calculating part may calculate the coefficient of distribution so that moments of forces in two rotational directions acting in opposite directions to each other can be balanced by a rotational force due to the thrust force of the first driving part and a rotational force due to the thrust force of the second driving part in the rotational direction acting around the axis of the center of gravity of the moving body unit.

The driving thrust force command value calculating part may distribute thrust force command values $f_1$ and $f_2$ based on the following formulas $$f_1 = (-\alpha x + g_{10}) \cdot f^* + (\beta x + h_0) \cdot \tau^*$$

$$f_2 = (\alpha x + g_{20}) \cdot f^* - (\beta x + h_0) \cdot \tau^*$$

where "$f_1$" and "$f_2$" denote thrust force command values for the first driving part and the second driving part, respectively; "x" denotes a position measuring value of the second moving body moving in a biaxial direction; "$g_{10}$" and "$g_{20}$" denote a ratio of thrust force command distribution in a first axis translation direction where a moment of a force around the center of gravity of the moving body unit in a case of "x=0"; "$\alpha$" denotes a changing ratio, due to change of "x", of distance between the center of gravity of the moving body and the first and second driving parts; "$h_0$" denotes a thrust force gain of a rotational direction position control loop around the third axis in the center of gravity in the case of "x=0"; "$\beta$" denotes a changing ratio, due to change of "x", of a moment of inertia in a direction around the third axis in the center of gravity of the moving body unit; "f*" denotes a translation direction thrust force command value in the first axis direction; and "$\tau^*$" denotes a thrust force command value to the rotational direction around the third axis. The translation direction thrust force command value in the first axis direction may prevent generation of a yawing torque at the center of gravity of the moving body unit; and the thrust force command value to the rotational direction around the third axis may prevent generation of a translation thrust force to the center of gravity of the moving body unit.

According to the embodiments of the present invention, it is also possible to provide a stage device, including: a fixed base; a first stage movably provided in a first axial direction against the fixed base; a second stage movably provided at the first stage in a second axial direction perpendicular to the first axial direction; first and second driving parts configured to apply thrust forces to vicinities of corresponding ends of the first stage; a third driving part configured to drive the second stage; first and second position detectors configured to detect moving positions in the vicinities of the corresponding ends of the first stage; a third position detector configured to detect a moving position of the second stage; and a control part configured to control the first and second driving parts so that a moving body unit formed by the first stage and the second stage is moved; wherein the control part includes a position of center of gravity calculating part configured to calculate a position of a center of gravity of the moving body unit corresponding to a moving position of the second moving body; a coefficient of distribution calculating part configured to calculate a coefficient of distribution setting a distribution ratio of a thrust force of the first driving part to a thrust force of the second driving part corresponding to the position of the center of gravity calculated by the position of center of gravity calculating part; a command value calculating part configured to multiply a first axis thrust force target value calculated by a position control compensator in the first axial direction by the coefficient of distribution calculated by the coefficient of distribution calculating part and configured to calculate a first axis thrust force command value for the first and second driving parts so that moments of forces in rotational directions due to the thrust forces of the first and second driving parts acting around the axis of the center of gravity are balanced; a moment of inertia calculating part configured to calculate a moment of inertia in a rotational direction wherein the position of the center of gravity of the moving body unit that changes corresponding to the moving position of the second moving body is an axis; a rotational direction thrust force calculating part configured to calculate a third axis thrust force command value around the axis of the center of gravity so that a ratio of the moment of inertia calculated by the moment of inertia calculating part to a thrust force gain of a position control compensator in the rotational direction is constant; and a driving thrust force command value calculating part configured to calculate thrust force command values for the first and second driving parts by using the first axis thrust force command value and the third axis thrust force command value, respectively.

In the stage device, coordinate positions of the ends of the first moving body and a coordinate position of the second moving body may be detected by a three axis position detector; and the coordinate positions may be converted to the first and second axial directions and the rotational direction and supplied to the position control compensator as a position feedback value.

The coefficient of distribution calculating part may calculate the coefficient of distribution so that moments of forces in two rotational directions acting in opposite directions to each other can be balanced by a rotational force due to the thrust force of the first driving part and a rotational force due to the thrust force of the second driving part in the rotational direction acting around the axis of the center of gravity of the moving body unit.

The driving thrust force command value calculating part may distribute thrust force command values $f_1$ and $f_2$ based on the following formulas $$f_1 = (-\alpha x + g_{10}) \cdot f^* + (\beta x + h_0) \cdot \tau^*$$

$$f_2 = (\alpha x + g_{20}) \cdot f^* - (\beta x + h_0) \cdot \tau^*$$

where "$f_1$" and "$f_2$" denote thrust force command values for the first driving part and the second driving part, respectively; "x" denotes a position measuring value of the second moving body moving in a biaxial direction; "$g_{10}$" and "$g_{20}$" denote a ratio of thrust force command distribution in a first axis translation direction where a moment of a force around the center of gravity of the moving body unit in a case of "x=0"; "$\alpha$" denotes a changing ratio, due to change of "x", of distance between the center of gravity of the moving body and the first and second driving parts; "$h_0$" denotes a thrust force gain of a rotational direction position control loop around the third axis in the center of gravity in the case of "x=0"; "$\beta$" denotes a changing ratio, due to change of "x", of a moment of inertia in a direction around the third axis in the center of gravity of the moving body unit; "f*" denotes a translation direction thrust force command value in the first axis direction; and "$\tau^*$" denotes a thrust force command value to the rotational direction around the third axis. The translation direction thrust force command value in the first axis direction may prevent generation of a yawing torque at the center of gravity of the moving body unit; and the thrust force command value to the rotational direction around the third axis may prevent generation of a translation thrust force to the center of gravity of the moving body unit.

According to the embodiments of the present invention, it is also possible to provide a position control method of a moving body, wherein first and second driving parts configured to drive corresponding ends of a first moving body movably provided in a first axial direction and a third driving part configured to drive a second moving body moving a second axial direction perpendicular to the first axial direction are controlled so that a moving body unit formed by the first moving body and the second moving body is moved, the position control method of the moving body including: a position of center of gravity calculating step of calculating a position of a center of gravity of the moving body unit corresponding to a moving position of the second moving body; a coefficient of distribution calculating step of calculating a coefficient of distribution setting a distribution ratio of a thrust force of the first driving part and a thrust force of the second driving part corresponding to the position of the center of gravity calculated by the position of center of gravity calculating step; a command value calculating step of multiplying a first axis thrust force target value calculated by a position control compensator in the first axial direction by the coefficient of distribution calculated by the coefficient of distribution calculating step and configured to calculate a first axis thrust force command value of the first and second driving parts so that moments of forces in rotational directions due to the thrust forces on the first and second driving parts acting around the axis of the center of gravity are balanced; a moment of inertia calculating step of calculating a moment of inertia in a rotational direction wherein the position of the center of gravity of the moving body unit that changes corresponding to the moving position of the second moving body is an axis; a rotational direction thrust force calculating step of calculating a third axis thrust force command value around the axis of the center of gravity so that a ratio of the moment of inertia calculated by the moment of inertia calculating step to a thrust force gain of a position control compensator in the rotational direction is constant; and a driving thrust force command value calculating step of calculating thrust force command values for the first and second driving parts by using the first axis thrust force command value and the third axis thrust force command value, respectively.

Coordinate positions of the ends of the first moving body and a coordinate position of the second moving body may be detected by a three axis position detector; and the coordinate positions may be converted to the first and second axial directions and the rotational direction and supplied to the position control compensator as a position feedback value.

In the coefficient of distribution calculating step, the coefficient of distribution may be calculated so that moments of forces in two rotational directions acting in opposite directions to each other can be balanced by a rotational force due to the thrust force of the first driving part and a rotational force due to the thrust force of the second driving part in the rotational direction acting around the axis of the center of gravity of the moving body unit.

In the driving thrust force command value calculating step, thrust force command values $f_1$ and $f_2$ may be distributed based on the following formulas $$f_1 = (-\alpha x + g_{10}) \cdot f^* + (\beta x + h_0) \cdot \tau^*$$

$$f_2 = (\alpha x + g_{20}) \cdot f^* - (\beta x + h_0) \cdot \tau^*$$

where "$f_1$" and "$f_2$" denote thrust force command values for the first driving part and the second driving part, respectively; "x" denotes a position measuring value of the second moving body moving in a biaxial direction; "$g_{10}$" and "$g_{20}$" denote a ratio of thrust force command distribution in a first axis translation direction where a moment of a force around the center of gravity of the moving body unit in a case of "x=0"; "$\alpha$" denotes a changing ratio, due to change of "x", of distance between the center of gravity of the moving body and the first and second driving parts; "$h_0$" denotes a thrust force gain of a rotational direction position control loop around the third axis in the center of gravity in the case of "x=0"; "$\beta$" denotes a changing ratio, due to change of "x", of a moment of inertia in a direction around the third axis in the center of gravity of the moving body unit; "$f^*$" denotes a translation direction thrust force command value in the first axis direction; and "$\tau^*$" denotes a thrust force command value to the rotational direction around the third axis. The translation direction thrust force command value in the first axis direction may prevent generation of a yawing torque at the center of gravity of the moving body unit; and the thrust force command value to the rotational direction around the third axis may prevent generation of a translation thrust force to the center of gravity of the moving body unit.

The present invention is not limited to these embodiments, but variations and modifications may be made without departing from the scope of the present invention.

For example, in the above-discussed embodiment of the present invention, a case where the movable stage 18 of the stage device is translated is discussed. However, the present invention is not limited to this example. As long as a device has a structure where a pair of driving parts configured to drive both ends of the moving body is controlled, the present invention may be applied to any positioning stage mechanism of other types of devices such as a machine tool, semiconductor manufacturing device, or a measuring device.

What is claimed is:

1. A position control device of a moving body, wherein first and second driving parts configured to drive corresponding ends of a first moving body movably provided in a first axial direction and a third driving part configured to drive a second moving body moving a second axial direction perpendicular to the first axial direction are controlled so that a moving body unit formed by the first moving body and the second moving body is moved, the position control device of the moving body comprising:

a position of center of gravity calculating part configured to calculate a position of a center of gravity of the moving body unit corresponding to a moving position of the second moving body;

a coefficient of distribution calculating part configured to calculate a coefficient of distribution setting a distribution ratio of a thrust force of the first driving part and a thrust force of the second driving part corresponding to the position of the center of gravity calculated by the position of center of gravity calculating part;

a command value calculating part configured to multiply a first axis thrust force target value calculated by a position control compensator in the first axial direction by the coefficient of distribution calculated by the coefficient of distribution calculating part and configured to calculate a first axis thrust force command value of the first and second driving parts so that moments of forces in rotational directions due to the thrust forces on the first and second driving parts acting around the axis of the center of gravity are balanced;

a moment of inertia calculating part configured to calculate a moment of inertia in a rotational direction wherein the position of the center of gravity of the moving body unit that changes corresponding to the moving position of the second moving body is an axis;

a rotational direction thrust force calculating part configured to calculate a third axis thrust force command value around the axis of the center of gravity so that a ratio of the moment of inertia calculated by the moment of inertia calculating part to a thrust force gain of a position control compensator in the rotational direction is constant; and a driving thrust force command value calculating part configured to calculate thrust force command values for the first and second driving parts by using the first axis thrust force command value and the third axis thrust force command value, respectively.

2. The position control device of the moving body, as claimed in claim 1, wherein coordinate positions of the ends of the first moving body and a coordinate position of the second moving body are detected by a three axis position detector; and the coordinate positions are converted to the first and second axial directions and the rotational direction and supplied to the position control compensator as a position feedback value.

3. The position control device of the moving body, as claimed in claim 2, wherein the driving thrust force command value calculating part distributes thrust force command values $f_1$ and $f_2$ based on the following formulas $$f_1 = (-\alpha x + g_{10}) \cdot f^* + (\beta x + h_0) \cdot \tau^*$$

$$f_2 = (\alpha x + g_{20}) \cdot f^* - (\beta x + h_0) \cdot \tau^*$$

where "$f_1$" and "$f_2$" denote thrust force command values for the first driving part and the second driving part, respectively; "x" denotes a position measuring value of the second moving body moving in a biaxial direction; "$g_{10}$" and "$g_{20}$" denote a ratio of thrust force command distribution in a first axis translation direction where a moment of a force around the center of gravity of the moving body unit in a case of "x=0"; "$\alpha$" denotes a changing ratio, due to change of "x", of distance between the center of gravity of the moving body and the first and second driving parts; "$h_0$" denotes a thrust force gain of a rotational direction position control loop around the third axis in the center of gravity in the case of "x=0"; "$\beta$" denotes a changing ratio, due to change of "x", of a moment of inertia in a direction around the third axis in the center of gravity of the moving body unit; "$f^*$" denotes a translation direction thrust force command value in the first axis direction; and "$\tau^*$" denotes a thrust force command value to the rotational direction around the third axis.

4. The position control device of the moving body, as claimed in claim 3, wherein the translation direction thrust force command value in the first axis direction prevents generation of a yawing torque at the center of gravity of the moving body unit; and the thrust force command value to the rotational direction around the third axis prevents generation of a translation thrust force to the center of gravity of the moving body unit.

5. The position control device of the moving body, as claimed in claim 1, wherein the coefficient of distribution calculating part calculates the coefficient of distribution so that moments of forces in two rotational directions acting in opposite directions to each other are balanced by a rotational force due to the thrust force of the first driving part and a rotational force due to the thrust force of the second driving part in the rotational direction acting around the axis of the center of gravity of the moving body unit.

6. The position control device of the moving body, as claimed in claim 1, wherein the driving thrust force command value calculating part distributes thrust force command values $f_1$ and $f_2$ based on the following formulas $$f_1 = (-\alpha x + g_{10}) \cdot f^* + (\beta x + h_0) \cdot \tau^*$$

$$f_2 = (\alpha x + g_{20}) \cdot f^* - (\beta x + h_0) \cdot \tau^*$$

where "$f_1$" and "$f_2$" denote thrust force command values for the first driving part and the second driving part, respectively; "x" denotes a position measuring value of the second moving body moving in a biaxial direction; "$g_{10}$" and "$g_{20}$" denote a ratio of thrust force command distribution in a first axis translation direction where a moment of a force around the center of gravity of the moving body unit in a case of "x=0"; "$\alpha$" denotes a changing ratio, due to change of "x", of distance between the center of gravity of the moving body and the first and second driving parts; "$h_0$" denotes a thrust force gain of a rotational direction position control loop around the third axis in the center of gravity in the case of "x=0"; "$\beta$" denotes a changing ratio, due to change of "x", of a moment of inertia in a direction around the third axis in the center of gravity of the moving body unit; "$f^*$" denotes a translation direction thrust force command value in the first axis direction; and "$\tau^*$" denotes a thrust force command value to the rotational direction around the third axis.

7. A stage device, comprising:

a fixed base;

a first stage movably provided in a first axial direction against the fixed base;

a second stage movably provided at the first stage in a second axial direction perpendicular to the first axial direction;

first and second driving parts configured to apply thrust forces to vicinities of corresponding ends of the first stage;

a third driving part configured to drive the second stage;

first and second position detectors configured to detect moving positions in the vicinities of the corresponding ends of the first stage;

a third position detector configured to detect a moving position of the second stage; and a control part configured to control the first and second driving parts so that a moving body unit formed by the first stage and the second stage is moved;

wherein the control part includes a position of center of gravity calculating part configured to calculate a position of a center of gravity of the moving body unit corresponding to a moving position of the second moving body;

a coefficient of distribution calculating part configured to calculate a coefficient of distribution setting a distribution ratio of a thrust force of the first driving part to a thrust force of the second driving part corresponding to the position of the center of gravity calculated by the position of center of gravity calculating part;

a command value calculating part configured to multiply a first axis thrust force target value calculated by a position control compensator in the first axial direction by the coefficient of distribution calculated by the coefficient of distribution calculating part and configured to calculate a first axis thrust force command value for the first and second driving parts so that moments of forces in rotational directions due to the thrust forces of the first and second driving parts acting around the axis of the center of gravity are balanced;

a moment of inertia calculating part configured to calculate a moment of inertia in a rotational direction wherein the position of the center of gravity of the moving body unit that changes corresponding to the moving position of the second moving body is an axis;

a rotational direction thrust force calculating part configured to calculate a third axis thrust force command value around the axis of the center of gravity so that a ratio of the moment of inertia calculated by the moment of inertia calculating part to a thrust force gain of a position control compensator in the rotational direction is constant; and a driving thrust force command value calculating part configured to calculate thrust force command values for the first and second driving parts by using the first axis thrust force command value and the third axis thrust force command value, respectively.

8. The stage device as claimed in claim 7, wherein coordinate positions of the ends of the first moving body and a coordinate position of the second moving body are detected by a three axis position detector; and the coordinate positions are converted to the first and second axial directions and the rotational direction and supplied to the position control compensator as a position feedback value.

9. The stage device as claimed in claim 8, wherein the driving thrust force command value calculating part distributes thrust force command values $f_1$ and $f_2$ based on the following formulas $$f_1 = (-\alpha x + g_{10}) \cdot f^* + (\beta x + h_0) \cdot \tau^*$$

$$f_2 = (\alpha x + g_{20}) \cdot f^* - (\beta x + h_0) \cdot \tau^*$$

where "$f_1$" and "$f_2$" denote thrust force command values for the first driving part and the second driving part, respectively; "x" denotes a position measuring value of the second moving body moving in a biaxial direction; "$g_{10}$" and "$g_{20}$" denote a ratio of thrust force command distribution in a first axis translation direction where a moment of a force around the center of gravity of the moving body unit in a case of "x=0"; "$\alpha$" denotes a changing ratio, due to change of "x", of distance between the center of gravity of the moving body and the first and second driving parts; "$h_0$" denotes a thrust force gain of a rotational direction position control loop around the third axis in the center of gravity in the case of "x=0"; "$\beta$" denotes a changing ratio, due to change of "x", of a moment of inertia in a direction around the third axis in the center of gravity of the moving body unit; "$f^*$" denotes a translation direction thrust force command value in the first axis direction; and "$\tau^*$" denotes a thrust force command value to the rotational direction around the third axis.

10. The stage device as claimed in claim 9, wherein the translation direction thrust force command value in the first axis direction prevents generation of a yawing torque at the center of gravity of the moving body unit; and the thrust force command value to the rotational direction around the third axis prevents generation of a translation thrust force to the center of gravity of the moving body unit.

11. The stage device as claimed in claim 7, wherein the coefficient of distribution calculating part calculates the coefficient of distribution so that moments of forces in two rotational directions acting in opposite directions to each other are balanced by a rotational force due to the thrust force of the first driving part and a rotational force due to the thrust force of the second driving part in the rotational direction acting around the axis of the center of gravity of the moving body unit.

12. The stage device as claimed in claim 7, wherein the driving thrust force command value calculating part distributes thrust force command values $f_1$ and $f_2$ based on the following formulas $$f_1 = (-\alpha x + g_{10}) \cdot f^* + (\beta x + h_0) \cdot \tau^*$$

$$f_2 = (\alpha x + g_{20}) \cdot f^* - (\beta x + h_0) \cdot \tau^*$$

where "$f_1$" and "$f_2$" denote thrust force command values for the first driving part and the second driving part, respectively; "x" denotes a position measuring value of the second moving body moving in a biaxial direction; "$g_{10}$" and "$g_{20}$" denote a ratio of thrust force command distribution in a first axis translation direction where a moment of a force around the center of gravity of the moving body unit in a case of "x=0"; "$\alpha$" denotes a changing ratio, due to change of "x", of distance between the center of gravity of the moving body and the first and second driving parts; "$h_0$" denotes a thrust force gain of a rotational direction position control loop around the third axis in the center of gravity in the case of "x=0"; "$\beta$" denotes a changing ratio, due to change of "x", of a moment of inertia in a direction around the third axis in the center of gravity of the moving body unit; "$f^*$" denotes a translation direction thrust force command value in the first axis direction; and "$\tau^*$" denotes a thrust force command value to the rotational direction around the third axis.

13. A position control method of a moving body, wherein first and second driving parts configured to drive corresponding ends of a first moving body movably provided in a first axial direction and a third driving part configured to drive a second moving body moving a second axial direction perpendicular to the first axial direction are controlled so that a moving body unit formed by the first moving body and the second moving body is moved, the position control method of the moving body comprising:

a position of center of gravity calculating step of calculating a position of a center of gravity of the moving body unit corresponding to a moving position of the second moving body;

a coefficient of distribution calculating step of calculating a coefficient of distribution setting a distribution ratio of a thrust force of the first driving part and a thrust force of the second driving part corresponding to the position of the center of gravity calculated by the position of center of gravity calculating step;

a command value calculating step of multiplying a first axis thrust force target value calculated by a position control compensator in the first axial direction by the coefficient of distribution calculated by the coefficient of distribution calculating step and configured to calculate a first axis thrust force command value of the first and second driving parts so that moments of forces in rotational directions due to the thrust forces on the first and second driving parts acting around the axis of the center of gravity are balanced;

a moment of inertia calculating step of calculating a moment of inertia in a rotational direction wherein the position of the center of gravity of the moving body unit that changes corresponding to the moving position of the second moving body is an axis;

a rotational direction thrust force calculating step of calculating a third axis thrust force command value around the axis of the center of gravity so that a ratio of the moment of inertia calculated by the moment of inertia calculating step to a thrust force gain of a position control compensator in the rotational direction is constant; and a driving thrust force command value calculating step of calculating thrust force command values for the first and second driving parts by using the first axis thrust force command value and the third axis thrust force command value, respectively.

14. The position control device of the moving body, as claimed in claim 13,
wherein coordinate positions of the ends of the first moving body and a coordinate position of the second moving body are detected by a three axis position detector; and
the coordinate positions are converted to the first and second axial directions and the rotational direction and supplied to the position control compensator as a position feedback value.

15. The position control method of the moving body as claimed in claim 14,
wherein, in the driving thrust force command value calculating step, thrust force command values $f_1$ and $f_2$ are distributed based on the following formulas $$f_1 = (-\alpha x + g_{10}) \cdot f^* + (\beta x + h_0) \cdot \tau^*$$

$$f_2 = (\alpha x + g_{20}) \cdot f^* - (\beta x + h_0) \cdot \tau^*$$

where "$f_1$" and "$f_2$" denote thrust force command values for the first driving part and the second driving part, respectively; "$x$" denotes a position measuring value of the second moving body moving in a biaxial direction; "$g_{10}$" and "$g_{20}$" denote a ratio of thrust force command distribution in a first axis translation direction where a moment of a force around the center of gravity of the moving body unit in a case of "$x=0$"; "$\alpha$" denotes a changing ratio, due to change of "$x$", of distance between the center of gravity of the moving body and the first and second driving parts; "$h_0$" denotes a thrust force gain of a rotational direction position control loop around the third axis in the center of gravity in the case of "$x=0$"; "$\beta$" denotes a changing ratio, due to change of "$x$", of a moment of inertia in a direction around the third axis in the center of gravity of the moving body unit; "$f^*$" denotes a translation direction thrust force command value in the first axis direction; and "$\tau^*$" denotes a thrust force command value to the rotational direction around the third axis.

16. The position control method of the moving body as claimed in claim 15,
wherein the translation direction thrust force command value in the first axis direction prevents generation of a yawing torque at the center of gravity of the moving body unit; and
the thrust force command value to the rotational direction around the third axis prevents generation of a translation thrust force to the center of gravity of the moving body unit.

17. The position control method of the moving body as claimed in claim 13,
wherein, in the coefficient of distribution calculating step, the coefficient of distribution is calculated so that moments of forces in two rotational directions acting in opposite directions to each other are balanced by a rotational force due to the thrust force of the first driving part and a rotational force due to the thrust force of the second driving part in the rotational direction acting around the axis of the center of gravity of the moving body unit.

18. The position control method of the moving body as claimed in claim 13,
wherein, in the driving thrust force command value calculating step, thrust force command values $f_1$ and $f_2$ are distributed based on the following formulas $$f_1 = (-\alpha x + g_{10}) \cdot f^* + (\beta x + h_0) \cdot \tau^*$$

$$f_2 = (\alpha x + g_{20}) \cdot f^* - (\beta x + h_0) \cdot \tau^*$$

where "$f_1$" and "$f_2$" denote thrust force command values for the first driving part and the second driving part, respectively; "$x$" denotes a position measuring value of the second moving body moving in a biaxial direction; "$g_{10}$" and "$g_{20}$" denote a ratio of thrust force command distribution in a first axis translation direction where a moment of a force around the center of gravity of the moving body unit in a case of "$x=0$"; "$\alpha$" denotes a changing ratio, due to change of "$x$", of distance between the center of gravity of the moving body and the first and second driving parts; "$h_0$" denotes a thrust force gain of a rotational direction position control loop around the third axis in the center of gravity in the case of "$x=0$"; "$\beta$" denotes a changing ratio, due to change of "$x$", of a moment of inertia in a direction around the third axis in the center of gravity of the moving body unit; "$f^*$" denotes a translation direction thrust force command value in the first axis direction; and "$\tau^*$" denotes a thrust force command value to the rotational direction around the third axis.

* * * * *